US007473912B2

(12) United States Patent
Yang

(10) Patent No.: US 7,473,912 B2
(45) Date of Patent: Jan. 6, 2009

(54) METHOD AND APPARATUS FOR PATTERNING MICRO AND NANO STRUCTURES USING A MASK-LESS PROCESS

(76) Inventor: Xiao (Charles) Yang, 740 Webster St., Palo Alto, CA (US) 94301

( * ) Notice: Subject to any disclaimer, the term of this patent is extended or adjusted under 35 U.S.C. 154(b) by 247 days.

(21) Appl. No.: 11/558,441

(22) Filed: Nov. 9, 2006

(65) Prior Publication Data

US 2007/0224548 A1 Sep. 27, 2007

Related U.S. Application Data

(60) Provisional application No. 60/735,633, filed on Nov. 9, 2005.

(51) Int. Cl.
*A61N 5/00* (2006.01)
*G21K 5/10* (2006.01)
*G21K 5/00* (2006.01)

(52) U.S. Cl. .................. 250/492.22; 250/492.1; 250/492.2; 250/492.3; 250/442.11; 430/24; 430/25

(58) Field of Classification Search ............. 250/310, 250/311, 440.11, 441.11, 442.11, 492.1, 250/492.2, 492.22, 492.23, 492.3; 313/309, 313/310, 336, 351; 118/620, 625; 430/8, 430/24, 25, 494, 942, 945
See application file for complete search history.

(56) References Cited

U.S. PATENT DOCUMENTS

| 5,405,481 | A  | * | 4/1995  | Licoppe et al.  | 156/345.24 |
|-----------|----|---|---------|-----------------|------------|
| 5,637,951 | A  | * | 6/1997  | Parker          | 313/336    |
| 6,538,256 | B1 | * | 3/2003  | Mankos et al.   | 250/492.24 |
| 6,635,311 | B1 | * | 10/2003 | Mirkin et al.   | 427/256    |
| 7,361,310 | B1 | * | 4/2008  | Mirkin et al.   | 422/100    |
| 2004/0175631 | A1 | * | 9/2004 | Crocker et al. | 430/5 |
| 2005/0112505 | A1 | * | 5/2005 | Huang et al.   | 430/315 |
| 2006/0145097 | A1 | * | 7/2006 | Parker         | 250/492.22 |
| 2007/0074316 | A1 | * | 3/2007 | Alden et al.   | 977/762 |
| 2007/0224548 | A1 | * | 9/2007 | Yang           | 430/325 |
| 2007/0235665 | A1 | * | 10/2007 | Shamoun et al. | 250/492.23 |
| 2008/0052904 | A1 | * | 3/2008 | Schneider et al. | 29/846 |
| 2008/0143906 | A1 | * | 6/2008 | Allemand et al. | 349/43 |

* cited by examiner

*Primary Examiner*—Bernard E Souw
(74) *Attorney, Agent, or Firm*—Townsend and Townsend and Crew LLP

(57) ABSTRACT

According to a specific embodiment of the present invention, a mask-less lithography method and apparatus is provided. The apparatus includes an integrated write head on a slider with an air bearing that creates a lift force that allows that write head to fly over a spinning wafer substrate in nanometer distance without physical contact. The short distance between the write head and substrate prevents the light from diffracting. As a result, micro and nanometer structures can be patterned without being limited by light diffraction in conventional lithography methods.

20 Claims, 7 Drawing Sheets

METHOD AND APPARATUS FOR PATTERNING MICRO AND NANO STRUCTURES USING A MASK-LESS PROCESS

BACKGROUND OF THE INVENTION

This present application claims priority to U.S. Provisional Application No. 60/735,633, filed Nov. 9, 2005, commonly assigned, and hereby incorporated by reference herein.

BACKGROUND OF THE INVENTION

This present invention relates generally to manufacturing objects. More particularly, the invention relates to a method and apparatus for patterning micro and nano structures using a mask-less process. The method and apparatus can be applied to patterning micro and nano structures as well as other applications, for example, memory storage devices, micro-electromechanical systems, micro biological devices, and micro optical systems.

Micro structures have been commonly patterned by photolithography in the semiconductor fabrication process. However as the feature size or Critical Dimension (CD) approaches nanometer range, optical lithography becomes technically difficult due to diffraction limitation of the light source. Additionally, fabrication of masks becomes complex and prohibitively costly, especially for low volume devices such as ASICs (Application Specific Integrated Circuits). E-beam lithography is able to define small features using focus electronic beam. However, the throughput is low and inadequate for production. Furthermore, it is challenging to define features less than 10 nm even with E-beam due to electron scattering.

Thus, there is a need in the art for methods and apparatus for patterning micro and nanometer structures without hard masks and with high throughput.

SUMMARY OF THE INVENTION

The present invention relates to patterning micro and nano structures using a mask-less process. The method and apparatus can be applied to patterning micro and nano structures as well as other applications, for example, memory storage devices, micro-electromechanical systems, micro biological devices, and micro optical systems.

According to a specific embodiment of the present invention, a mask-less lithography method and apparatus is provided. The apparatus includes an integrated write head on a slider with an air bearing that creates a lift force that allows that write head to fly over a spinning wafer substrate in nanometer distance without physical contact. The short distance between the write head and substrate prevents the light from diffracting. As a result, micro and nanometer structures can be patterned without being limited by light diffraction in conventional lithography methods.

According to one embodiment of the present invention, the write head is a NFOS (Near-Field Optical Scanner) such as VCSEL (Vertical Cavity Surface Emitting Laser) or fiber or integrated optical wave guide. The writing method is similar to conventional optical lithography. The light intensity of the write head is modulated such that a photoresist layer on the wafer substrate is exposed or unexposed as the head moves over the wafer in nanometer distance.

In another embodiment, the write head is a Field Emission tip that emits electrons, and the writing method is similar to a E-beam lithography. The electron beam intensity of the write head is modulated such that an E-beam sensitive resist on the wafer substrate is exposed or unexposed as the head moves over the wafer in nanometer distance.

In a particular embodiment, multiple writing heads are in an array to increase the throughput. The multiple heads are supported by flexures and operable individually with air bearings. In another embodiment, the flexures are being actuated by electrode to adjust the head position to follow wafer topography and to pull the heads away from the wafer substrate when encountering large particles.

Many benefits are achieved by way of the present invention over conventional techniques. For example, the present technique provides an easy to use process that relies upon conventional technology. In some embodiments, the method provides for patterning micro and nanometer structures without being limited by light diffraction. In other embodiments, the method provides for high throughput mask-less lithography using an array of write heads. Additionally, the method provides a process that is compatible with conventional process technology without substantial modifications to conventional equipment and processes. In a specific embodiment, one or more of the exposed regions can include a gray scale pattern or a binary pattern. Such pattern can be provided by at least the selectively exposing process according to an embodiment of the present invention. Depending upon the embodiment, one or more of these benefits may be achieved. These and other benefits will be described in more throughout the present specification and more particularly below.

Various additional objects, features and advantages of the present invention can be more fully appreciated with reference to the detailed description and accompanying drawings that follow.

DETAILED DESCRIPTION OF THE INVENTION

The present invention relates to patterning micro and nano structures using a mask-less process. The method and apparatus can be applied to patterning micro and nano structures as well as other applications, for example, memory storage devices, micro-electromechanical systems, micro biological devices, and micro optical systems.

According to a specific embodiment of the present invention, a mask-less lithography method and apparatus is provided. The apparatus includes an integrated write head on a slider with an air bearing that creates a lift force that allows that write head to fly over a spinning wafer substrate in nanometer distance without physical contact, similar to operation principle of Hard Disk Drives. The short distance between the write head and substrate prevents the light from diffracting. As a result, micro and nanometer structures can be patterned without being limited by light diffraction in conventional lithography methods.

Figure 1:
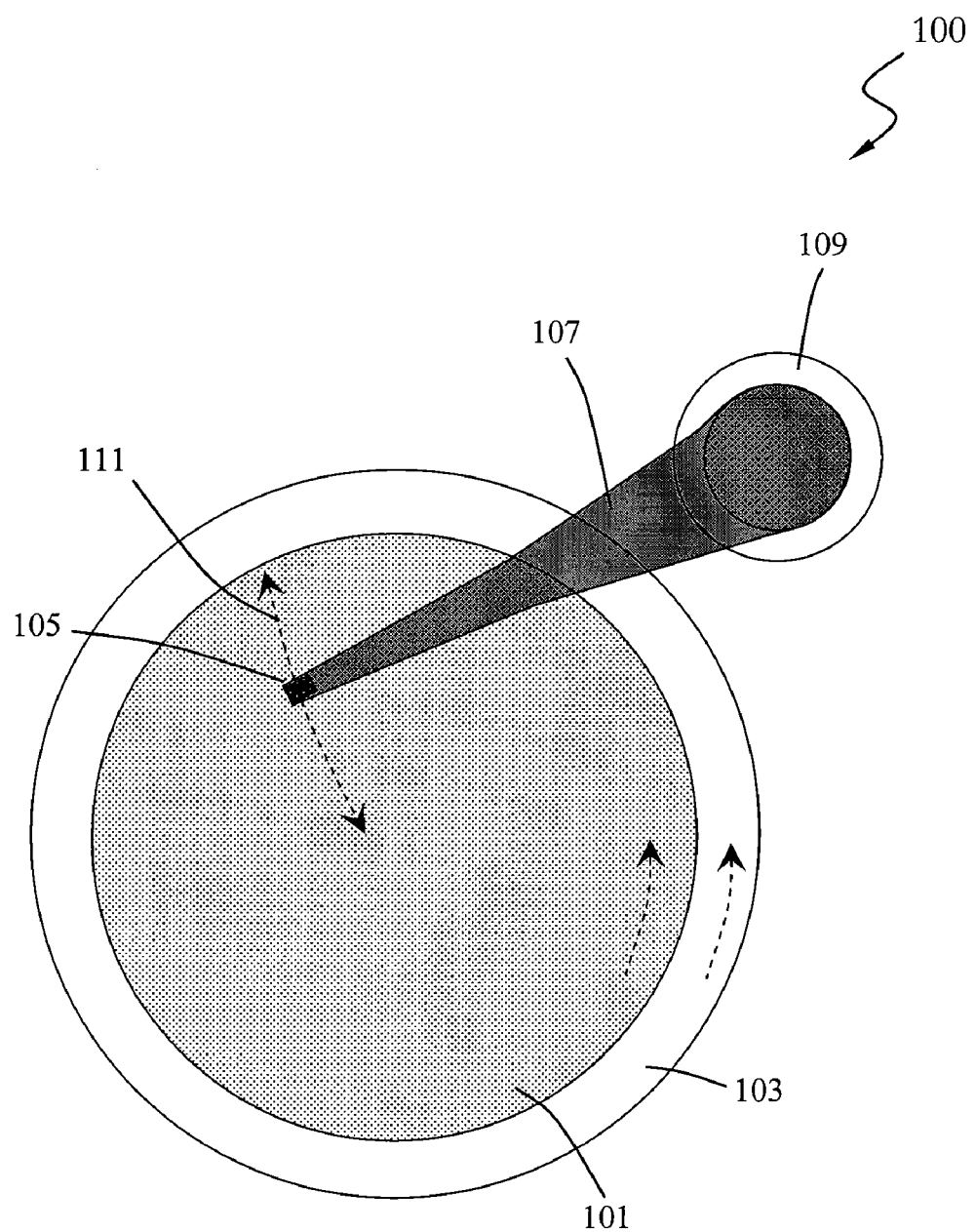
FIG. 1 is a simplified top-view diagram illustrating components of an apparatus for patterning nano and micro structures according to one embodiment of the present invention

FIG. 1 is a simplified top-view diagram illustrating components of an apparatus for patterning nano and micro structures according to one embodiment of the present invention. As illustrated, a wafer substrate 101 spins with a wafer check underneath 103. A write head 105 coupled to a suspension 107 and the suspension is coupled to a voice coil motor 109. The write head moves along a trajectory 111 that is normal to the rotation of the wafer. As a result, the write head is able to address any location of the wafer surface, similar to the operation of a Hard Disk Drive (HDD).

Figure 2:
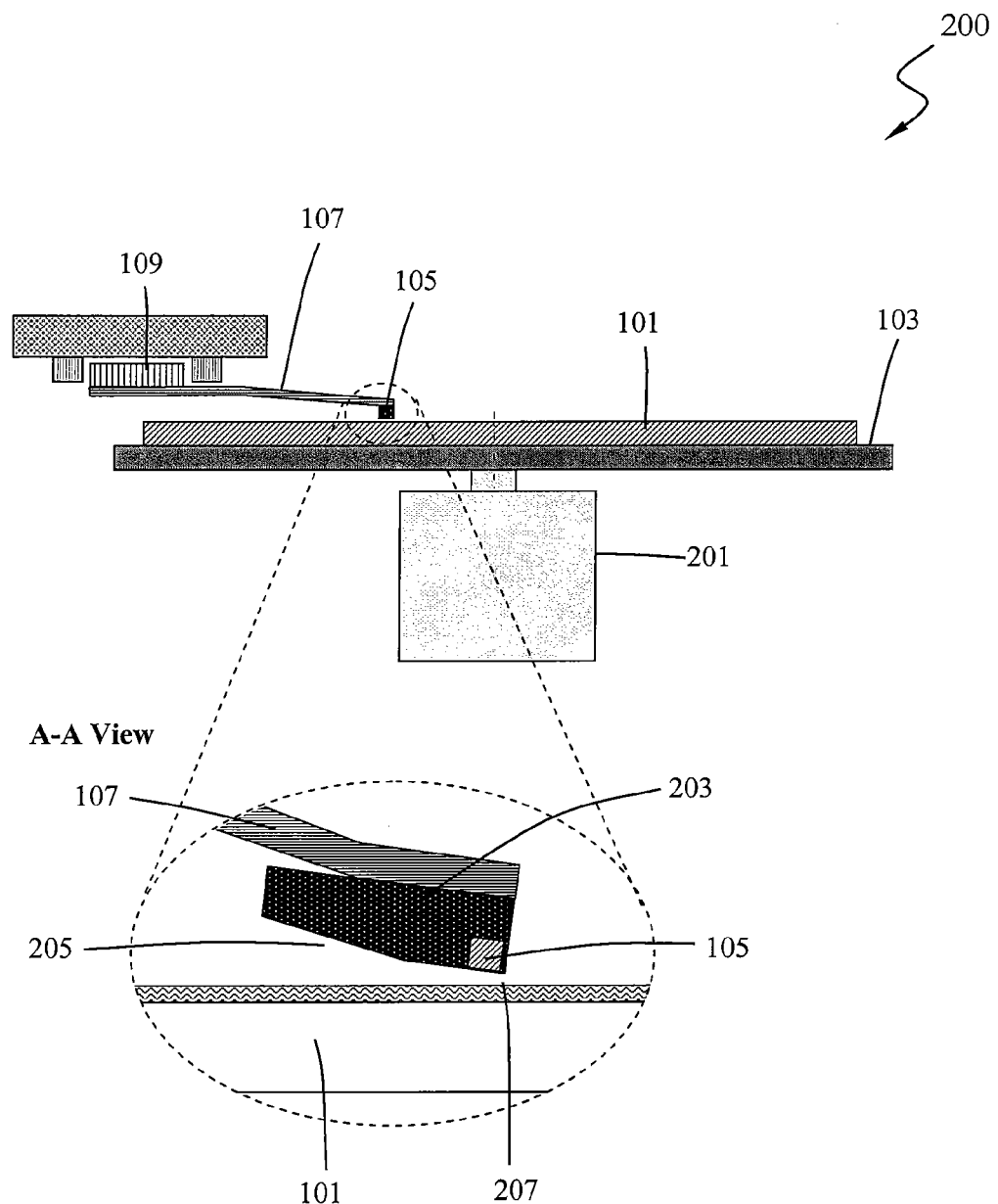
FIG. 2 is a simplified cross section diagram illustrating components of an apparatus for patterning nano and micro structures according to one embodiment of the present invention.

FIG. 2 is a simplified cross section diagram illustrating components of an apparatus for patterning nano and micro structures according to one embodiment of the present invention. As illustrated, the wafer 101 is coupled to a vacuum wafer chuck 103 that is coupled to a motor 201. As depicted in A-A zoom-in view, the write head element 105 is coupled to a slider 203 that has an air bearing 205. The slider 203 is attached to a suspension 107 that is coupled to a voice coil motor 109. A lift force created by the air bearing allows the head element 105 to follow the topographic wafer surface 207 in nanometer distance without crashing into it, similar to the operation of a Hard Disk Drive (HDD).

Figure 3:
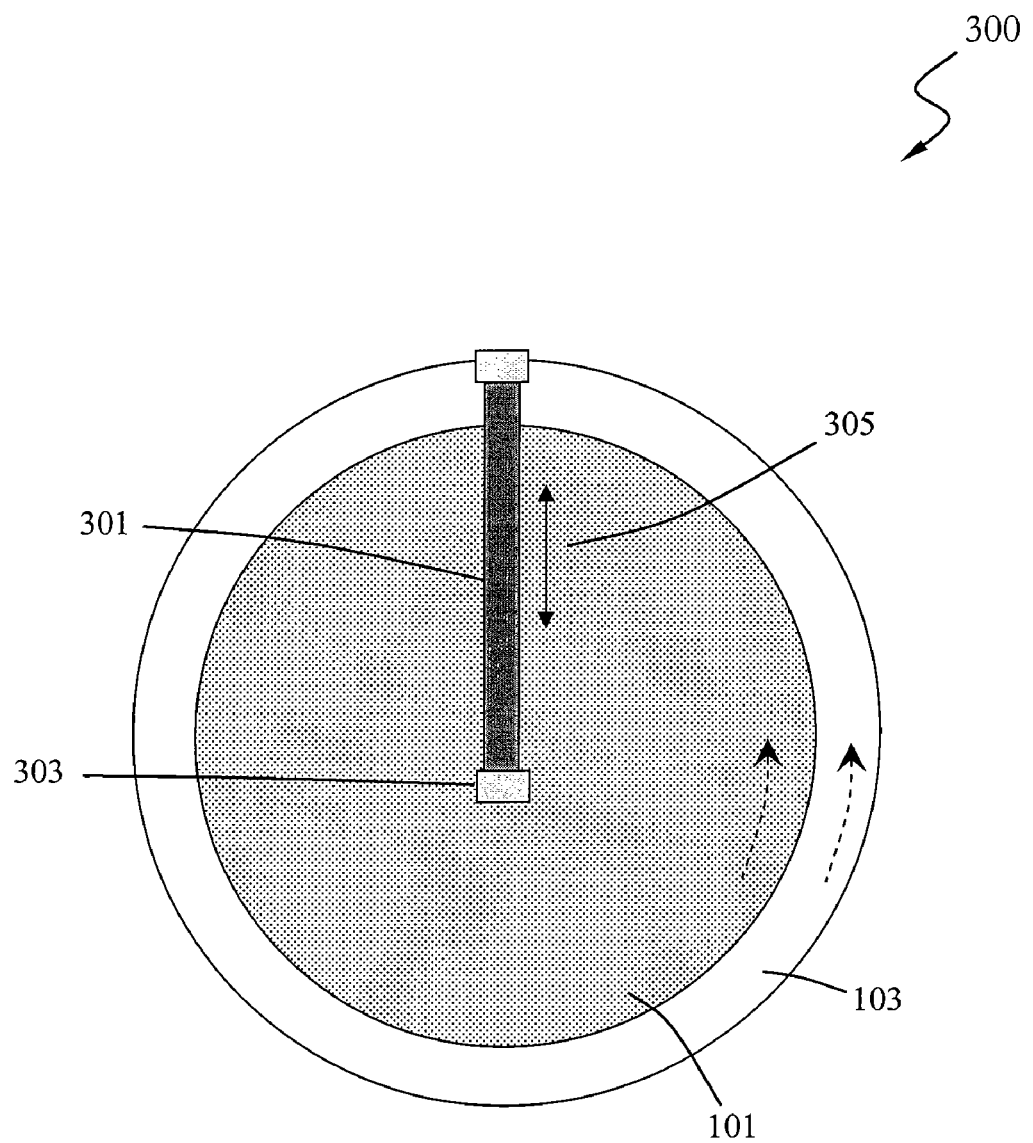
FIG. 3 is a simplified top-view diagram illustrating components of an apparatus for patterning nano and micro structures according to one embodiment of the present invention.
Figure 4:
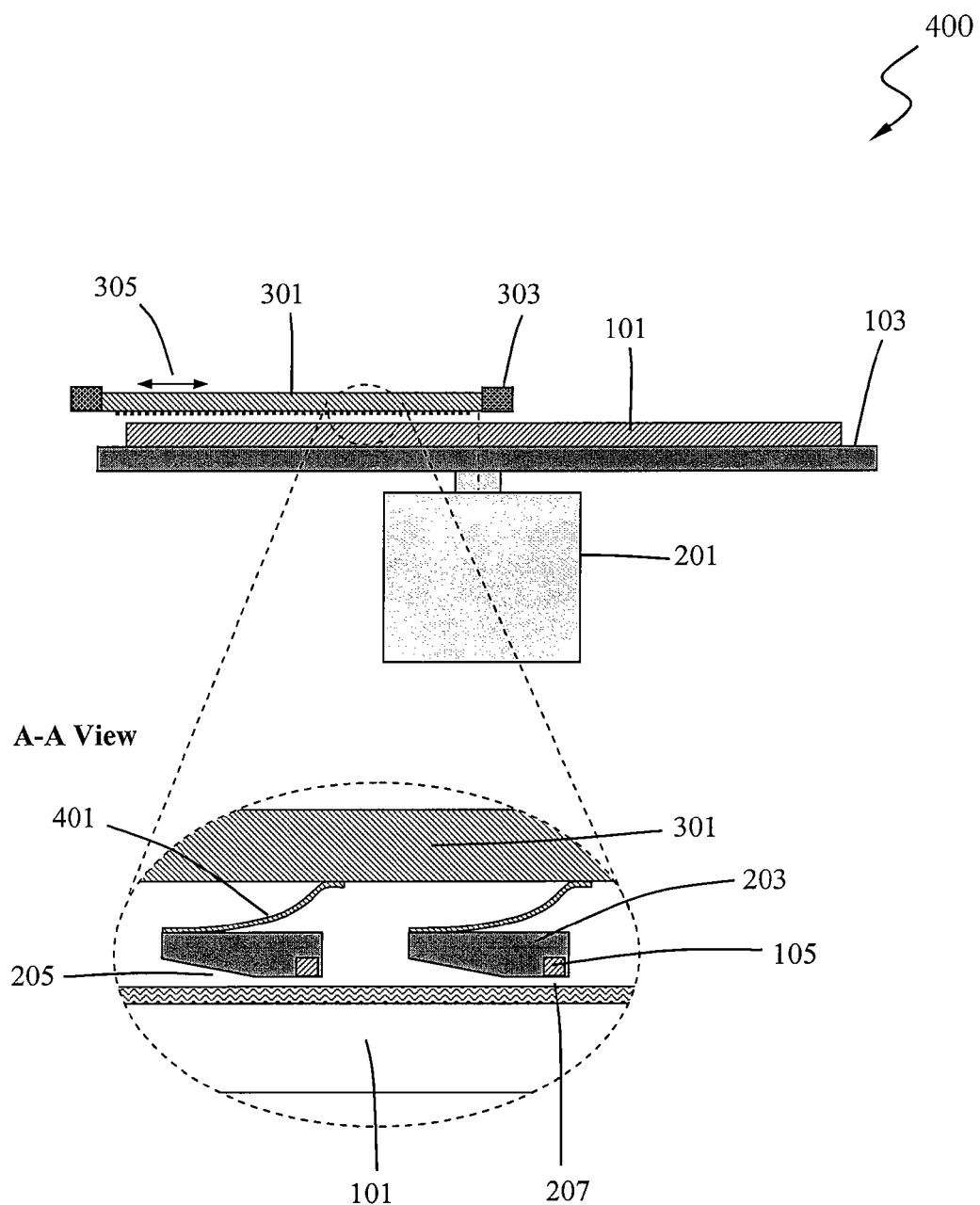
FIG. 4 is a simplified cross section diagram illustrating components of an apparatus for patterning nano and micro structures according to one embodiment of the present invention.

FIG. 3 is a simplified top-view diagram illustrating components of an apparatus for patterning nano and micro structures according to one embodiment of the present invention. As illustrated, a wafer substrate 101 spins with a wafer check underneath 103. An array of write heads individually coupled to an array of suspensions or flexures that are coupled to a suspension beam 301. The suspension beam is coupled to a nano positioning stage 303 such as a piezo drive stage that moves the write heads normal to the rotation of the wafer 305. As a result, the write heads are able to address any location of the wafer surface, FIG. 4 is a simplified cross section diagram illustrating components of an apparatus for patterning nano and micro structures according to one embodiment of the present invention. As illustrated, the wafer 101 is coupled to a vacuum wafer chuck 103 that is coupled to a motor 201. As depicted in A-A zoom-in view, an array of write heads 105 embedded in sliders 203 that are individually coupled to an array of suspensions or flexures 401 that are coupled to a suspension beam 301. The beam 301 is coupled to a nano positioning stage 303 such as piezo drive stage that moves the write heads normal to the rotation of the wafer 305. A lift force created by the air bearing 205 allows individual head element 105 to move up and down following the topographic wafer surface 207 in nanometer distance without crashing into it, similar to the operation of a Hard Disk Drive (HDD).

According to one embodiment of the present invention, the write head element is coupled to a slider that has a fluidic bearing. The slider is attached to a suspension that is attached to a beam. The beam is coupled to a nano positioning stage such as piezo drive stage that moves the write heads normal to the rotation of the wafer. The head elements are able to move up and down individually following the wafer topography at nanometer distance in a fluid media.

According to another embodiment of the present invention, the write head element is coupled to a slider that has an air bearing. The slider is attached to a suspension that is coupled to a linear stage. An air or gas nozzle blow air or gas between the slider and the wafer substrate. The air or gas flow cause the air bearing to generate a life force that enables the head element to fly over the topography of the wafer surface at nanometer distance.

Figure 5:
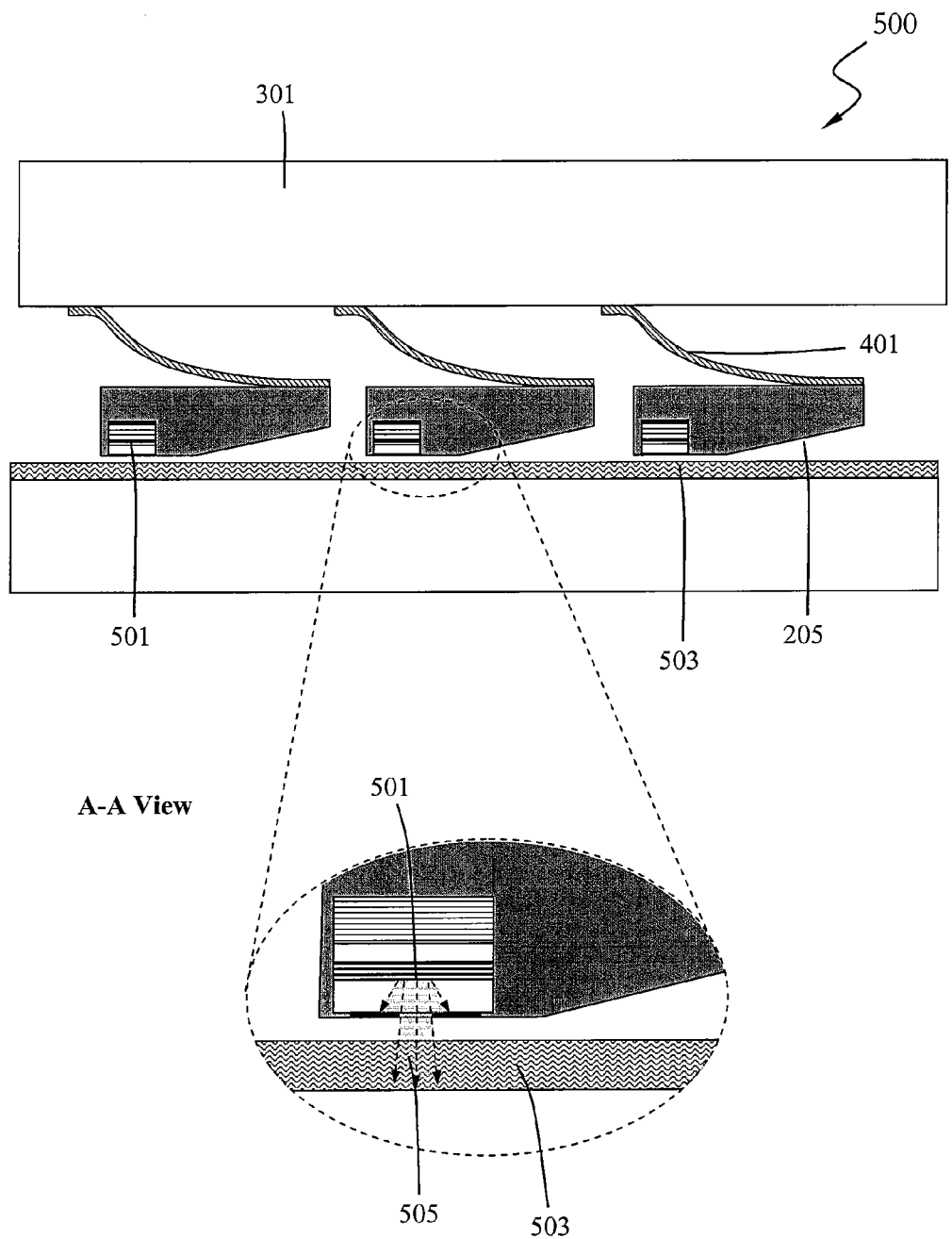
FIG. 5 is a simplified cross section diagram illustrating components of a NSOM (Near-field Scanning Optical Microscopy) based patterning method according to one embodiment of the present invention

FIG. 5 is a simplified cross section diagram illustrating components of a NSOM based patterning method according to one embodiment of the present invention. As illustrated, a NSOM element 501 such as VCSEL is coupled to a slider that flying over the topography of the wafer substrate. As depicted in A-A zoom-in view, the wafer substrate is coated with photoresist 503. As the NSOM write element flies over the wafer lifted by the air bearing 205, the photoresist at a specific location can be exposed or un-exposed by adjusting the intensity of the NSOM write element 505. As depicted, an array of NSOM elements can be configured to increase the throughput.

According to one embodiment of the present invention, the NSOM element such as a fiber or integrated wave guide is coupled to a slider that flies over the topography of the wafer substrate. An aperture is typically present to define the light beam size. The wafer substrate is coated with photoresist. As the NSOM write element flying over the wafer, the photoresist at a specific location can be exposed or un-exposed by adjusting the intensity of the NSOM write element. An array of NSOM elements can be configured to increase the throughput.

Figure 6:
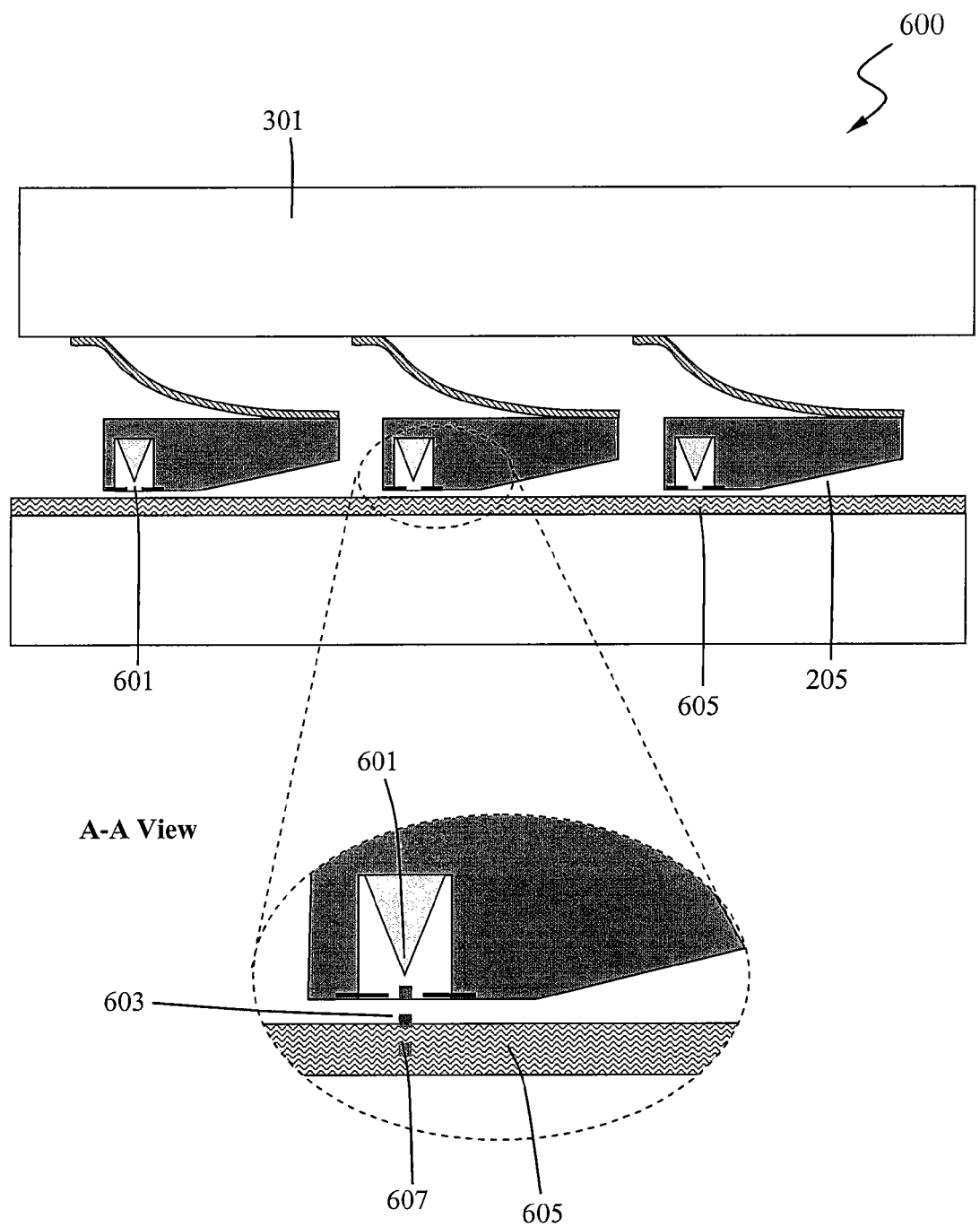
FIG. 6 is a simplified cross section diagram illustrating components of a Field Emission tip based patterning method according to one embodiment of the present invention.

FIG. 6 is a simplified cross section diagram illustrating components of a Field Emission (FE) tip based patterning method according to one embodiment of the present invention. As illustrated in A-A zoom-in view, a FE tip element 601 emits electron beam 603 and is coupled to a slider that flies over the topography of the wafer substrate. The wafer substrate is coated with E-beam sensitive resist 605. As the FE tip flying over the wafer, the resist at a specific location can be exposed or unexposed by controlling the electron emission of the FE tip 607. An array of FE tips can be configured to increase the throughput.

Figure 7:
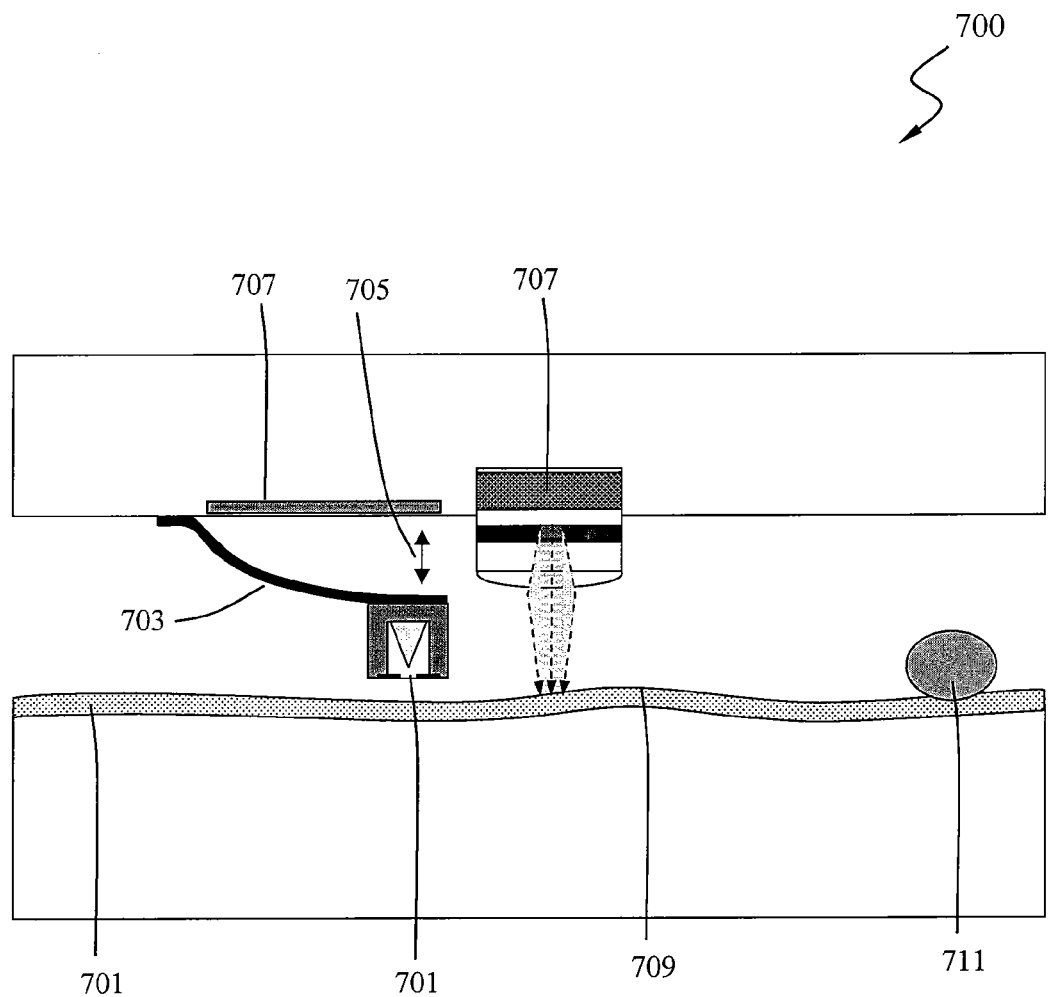
FIG. 7 is a simplified cross section diagram illustrating an apparatus of patterning nano and micro structures according to one embodiment of the present invention.

FIG. 7 is a simplified cross section diagram illustrating an apparatus of patterning nano and micro structures according to one embodiment of the present invention. As illustrated, a write element 701 is coupled to a flexure 703. The flexure is operable in a vertical direction 705 by an addressing electrode 707 via electrostatic force. A sensing element 707 is configured before the write element. The sensing element measures the topography 709 and particles 711 of the wafer. The topography information is fed back to the control electrode 707. An appropriate voltage is applied to actuate the flexure up and down 705. As a result, the write element maintains a constant distance from the wafer surface. The write element is a NSOM or FE write element.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A method for patterning one or more surface regions using a mask-less process, the method comprising:
   providing a substrate including a surface region, the surface region having a thickness of particle sensitive material overlying the surface region, the thickness of particle sensitive material having a surface topography;

suspending a head member including a particle source and an air bearing region over a spatial portion of the surface topography of the thickness of particle sensitive material provided on the surface region of the substrate;

moving the surface region including the particle sensitive material relative to the head member including the particle source to cause an air flow between the air bearing region and a portion of the surface topography to create a lifting force using at least the air bearing region as the air bearing region moves relative to the surface topography of the particle sensitive material, while the head member being suspended by a suspension member coupled to the head member;

selectively exposing one or more portions of the particle sensitive material using the particle source provided on the head member while the particle sensitive material is being moved relative to the head member to form one or more exposed patterns on the particle sensitive material.

2. The method of claim 1 wherein the moving is provided by rotating the substrate about a center region.

3. The method of claim 1 wherein the moving is provided by rotating the substrate including the surface topography about a center region, while the air bearing region moves along the surface topography.

4. The method of claim 1 wherein the particle source is selected from a light source, a laser diode device, an optical waveguide, and a field emission source.

5. The method of claim 1 wherein the substrate is selected from a semiconductor wafer, a glass substrate, a quartz substrate, a multilayered substrate, or a silicon wafer.

6. The method of claim 1 wherein the particle source is coupled to an aperture region.

7. The method of claim 1 wherein the particle source is coupled to a lens region, the lens region being provided to focus a beam from the particle source.

8. The method of claim 1 wherein the head member is one of a plurality head members, each of the head members being suspended from a respective suspension member.

9. The method of claim 8 wherein the plurality of head members are spatially disposed along a portion of the surface topography.

10. The method of claim 9 wherein each of the plurality of head members is coupled to a stage member.

11. The method of claim 10 wherein the stage member is operable to provide movement from a first location to a second location of at least one of the head members.

12. The method of claim 1 wherein the particle sensitive material is a photoresist material, an electron sensitive material, or a chemical sensitive material.

13. A method for patterning one or more surface regions using a mask-less process, the method comprising:

providing a substrate including a surface region, the surface region having a thickness of particle sensitive material overlying the surface region, the thickness of particle sensitive material having a surface topography;

suspending a head member including a particle source region over a spatial portion of the surface topography of the thickness of particle sensitive material provided on the surface region of the substrate;

capturing an indication associated with a variable height of the spatial portion of the surface topography relative to a fixed height before the head member including the particle source moves within a vicinity of the spatial portion of the surface topography;

adjusting the head member to a desired distance between the particle source and the spatial portion of the surface topography, if the variable height is outside of a desired range;

selectively exposing one or more portions of the particle sensitive material at the spatial portion using the particle source provided on the head member to form one or more exposed patterns on the particle sensitive material.

14. The method of claim 13 wherein the indication is captured using a sensing device and wherein the one or more exposed patterns comprises at least one gray scale pattern or one binary pattern.

15. The method of claim 14 wherein the sensing device is selected from an optical element, an acoustic element, a capacitive element, an inductive element, and an electromagnetic element.

16. The method of claim 15 wherein the sensing device is coupled to the head member.

17. The method of claim 13 wherein the particle source is selected from an electromagnetic source, a field emission source, a chemical source, and an electron source.

18. The method of claim 13 wherein the adjusting is provided by an electrostatic force between the head member and an electrode member.

19. The method of claim 13 wherein the adjusting is provided by a feedback process from the indication being captured.

20. Apparatus for patterning one or more surface regions using a mask-less process, the apparatus comprising:

a substrate holder, the substrate holder being adapted to maintain a substrate including a surface region, the surface region having a thickness of particle sensitive material overlying the surface region, the thickness of particle sensitive material having a surface topography;

a suspension member operably coupled to the substrate holder;

a head member coupled to the suspension member, the head member including a particle source and an air bearing region, the air bearing region over a spatial portion of the surface topography of the thickness of particle sensitive material provided on the surface region of the substrate;

a spacing provided between the particle source and the spatial portion of the surface topography of the thickness of the particle sensitive material;

a drive device adapted to move the surface region including the particle sensitive material relative to the head member including the particle source to cause an air flow between the air bearing region and a portion of the surface topography to create a lifting force using at least the air bearing region as the air bearing region moves relative to the surface topography of the particle sensitive material, while the head member being suspended by the suspension member coupled to the head member; and a controller device coupled to the particle source, the controller device being adapted to selectively expose one or more portions of the particle sensitive material using the particle source while the particle sensitive material is being moved relative to the head member to form one or more exposed patterns on the particle sensitive material.

* * * * *